US011201209B2

(12) United States Patent
Imam et al.

(10) Patent No.: US 11,201,209 B2
(45) Date of Patent: Dec. 14, 2021

(54) SEMICONDUCTOR DEVICE AND METHOD FOR FORMING THE SAME

(71) Applicant: Nuvoton Technology Corporation, Hsinchu (TW)

(72) Inventors: Syed Neyaz Imam, Bihar (IN); Po-An Chen, Toufen (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/692,023

(22) Filed: Nov. 22, 2019

(65) Prior Publication Data

US 2020/0203475 A1 Jun. 25, 2020

(30) Foreign Application Priority Data

Dec. 21, 2018 (TW) .................................. 107146297

(51) Int. Cl.
*H01L 29/06* (2006.01)
*H01L 29/10* (2006.01)
(Continued)

(52) U.S. Cl.
CPC ........ *H01L 29/063* (2013.01); *H01L 21/2253* (2013.01); *H01L 21/266* (2013.01);
(Continued)

(58) Field of Classification Search
CPC ................. H01L 21/266; H01L 21/265; H01L 21/26513; H01L 21/2652; H01L 21/2253;
(Continued)

(56) References Cited

U.S. PATENT DOCUMENTS 5,736,445 A * 4/1998 Pfirsch .................. H01L 21/266
  438/275
2010/0181616 A1* 7/2010 Takehiro ............. H01L 29/0696
  257/336

(Continued)

FOREIGN PATENT DOCUMENTS

TW   201535636 A   9/2015
TW   201633459 A   9/2016
TW   201714305 A   4/2017

OTHER PUBLICATIONS

Office Action and Search Report issued in corresponding TW application No. 107146297 dated Apr. 7, 2020.

*Primary Examiner* — Jose R Diaz
(74) *Attorney, Agent, or Firm* — Muncy, Geissler, Olds & Lowe, P.C.

(57) ABSTRACT

A method includes providing a semiconductor substrate, and forming a first N-type implant region and a second N-type implant region in the semiconductor substrate. The first N-type implant region and the second N-type implant region are separated by a portion of the semiconductor substrate. The method also includes forming a first P-type implant region in the semiconductor substrate, and performing a heat treatment process on the semiconductor substrate to form an N-type well region and a P-type well region in the semiconductor substrate. The N-type well region has a first portion, a second portion, and a third portion between the first portion and the second portion. The doping concentration of the third portion is lower than the doping concentration of the first portion and the doping concentration of the second portion.

17 Claims, 16 Drawing Sheets

(51) Int. Cl.
  *H01L 29/78*   (2006.01)
  *H01L 29/66*   (2006.01)
  *H01L 21/266*  (2006.01)
  *H01L 21/225*  (2006.01)
  *H01L 21/324*  (2006.01)
  *H01L 21/8234* (2006.01)
  *H01L 29/40*   (2006.01)
  *H01L 21/765*  (2006.01)
  *H01L 21/265*  (2006.01)

(52) U.S. Cl.
  CPC ...... *H01L 21/26513* (2013.01); *H01L 21/324* (2013.01); *H01L 21/765* (2013.01); *H01L 21/823493* (2013.01); *H01L 29/1095* (2013.01); *H01L 29/408* (2013.01); *H01L 29/66681* (2013.01); *H01L 29/7816* (2013.01)

(58) Field of Classification Search
  CPC ............... H01L 21/324; H01L 21/3242; H01L 21/823493; H01L 21/29; H01L 21/7816; H01L 21/66681; H01L 21/7835; H01L 21/66659; H01L 21/1095; H01L 29/0886; H01L 29/0878; H01L 29/7835; H01L 29/063; H01L 29/1095; H01L 29/7816; H01L 29/66681
  See application file for complete search history.

(56) References Cited

U.S. PATENT DOCUMENTS

| | | | |
|---|---|---|---|
| 2016/0099346 A1* | 4/2016 | Yang | H01L 29/66689 257/339 |
| 2016/0141369 A1* | 5/2016 | Kim | H01L 29/7835 257/655 |
| 2020/0006549 A1* | 1/2020 | Sadovnikov | H01L 29/0847 |

* cited by examiner

SEMICONDUCTOR DEVICE AND METHOD FOR FORMING THE SAME

CROSS REFERENCE TO RELATED APPLICATIONS

This application claims priority of Taiwan Patent Application No. 107146297 filed on Dec. 21, 2018, the entirety of which are incorporated by reference herein.

BACKGROUND

Embodiments of the present disclosure relate to a semiconductor device, and in particular they relate to a lateral diffused metal-oxide-semiconductor (LDMOS) field effect transistor and a method for forming the same.

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor devices and their manufacturing processes have generally been adequate for their intended purposes, as device scaling-down continues, they have not been entirely satisfactory in all respects.

SUMMARY

Some embodiments of the present disclosure relate to a method for forming a semiconductor device. The method includes providing a semiconductor substrate, and forming a first N-type implant region and a second N-type implant region in the semiconductor substrate. The first N-type implant region and the second N-type implant region are separated by a portion of the semiconductor substrate. The method also includes forming a first P-type implant region in the semiconductor substrate. The first N-type implant region is between the second N-type implant region and the first P-type implant region. The method also includes performing a heat treatment process on the semiconductor substrate to form an N-type well region and a P-type well region in the semiconductor substrate. The N-type well region has a first portion, a second portion, and a third portion. The first portion is between the third portion and the P-type well region. The third portion is between the first portion and the second portion. A doping concentration of the third portion is lower than a doping concentration of the first portion and a doping concentration of the second portion. The method also includes forming a gate dielectric layer on the semiconductor substrate. The gate dielectric layer covers the P-type well region and the N-type well region. The method also includes forming a gate electrode on the gate dielectric layer.

Some embodiments of the present disclosure relate to a semiconductor device. The semiconductor device includes a semiconductor substrate, a P-type well region in the semiconductor substrate, and an N-type well region in the semiconductor substrate and adjacent to the P-type well region. The N-type well region has a first portion, a second portion, and a third portion. The first portion is between the third portion and the P-type well region. The third portion is between the first portion and the second portion. A doping concentration of the third portion is lower than a doping concentration of the first portion and a doping concentration of the second portion. The semiconductor device also includes an N-type source region in the P-type well region, an N-type drain region in the N-type well region, and a gate dielectric layer on the semiconductor substrate. The gate dielectric layer partially covers the P-type well region and the N-type well region. The semiconductor device also includes a gate electrode on the gate dielectric layer. There is a first interface between the third portion of the N-type well region and the first portion of the N-type well region. The first interface is aligned with a sidewall of the gate electrode.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1C' illustrates a doping concentration profile of an N-type well region, in accordance with some embodiments of the present disclosure.

DETAILED DESCRIPTION

Figure 1A:
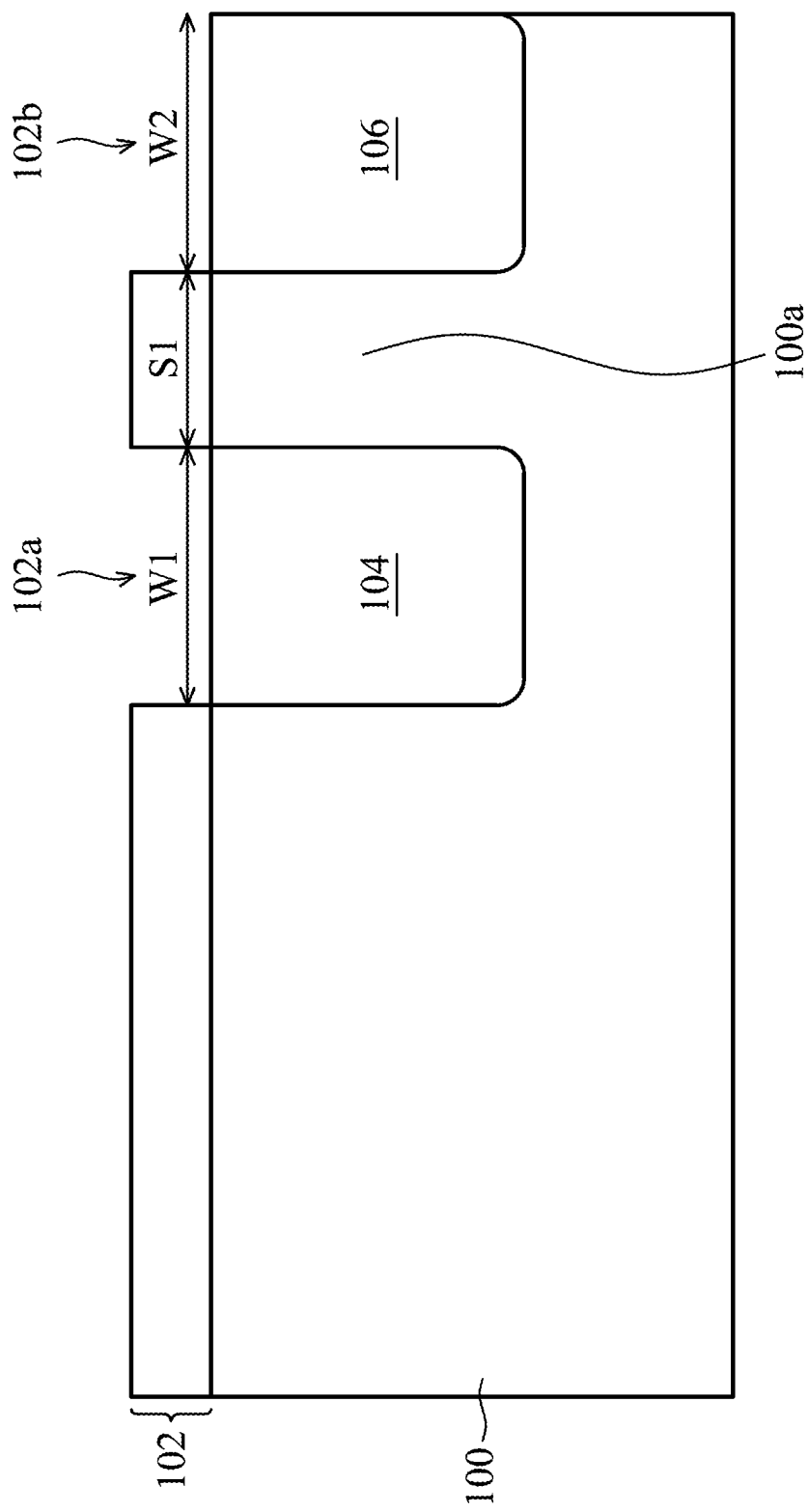
FIGS. 1A, 1B, 1C, 1D, 1E, 1F, 1G, 1H, 1I, 1J, and 1K are a series of process cross-sectional views illustrating a method for forming a semiconductor device, in accordance with some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

It should be understood that additional steps can be implemented before, during, or after the illustrated methods, and some steps might be replaced or omitted in other embodiments of the illustrated methods.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meanings as commonly understood by one of ordinary skill in the art to which the present disclosure pertains. It should be understood that these terms, such as those defined in commonly used dictionaries, should be interpreted as having meanings consistent with the relevant art and the background or context of the present disclosure, and should not be interpreted in an idealized or overly formal manner, unless specifically defined in the embodiments of the present disclosure.

The present disclosure may repeat reference numerals and/or letters in the various embodiments. This repetition is for the purpose of simplicity and clarity and does not in itself dictate a relationship between the various embodiments and/or configurations discussed.

The N-type well region of the semiconductor device of embodiments of the present disclosure has a first portion, a second portion, and a third portion that is between the first portion and the second portion. The doping concentration of the third portion of the N-type well region is lower than the doping concentration of the first portion of the N-type well region and the doping concentration of the second portion of the N-type well region, so that the breakdown voltage of the semiconductor device can be increased. In addition, according to embodiments of the present disclosure, the first N-type implant region and the second N-type implant region that are separated by a portion of the semiconductor substrate are formed in the semiconductor substrate by performing an ion implantation process using a single implant mask, so that the first portion, the second portion and the third portion of the N-type well region discussed above can be formed without using additional implant masks. Therefore, the breakdown voltage of the semiconductor device can be increased without increasing the manufacturing cost of the semiconductor device.

Firstly, a semiconductor substrate 100 is provided, as shown in FIG. 1A in accordance with some embodiments. The semiconductor substrate 100 may be a silicon substrate, but embodiments of the present disclosure are not limited thereto. In some embodiments, the semiconductor substrate 100 includes epitaxial semiconductor layer(s). In some embodiments, the semiconductor substrate 100 includes a single crystal substrate, a multi-layer substrate, a gradient substrate, another applicable substrate, or a combination thereof. In some embodiments, the semiconductor substrate 100 is a P-type substrate. For example, the P-type substrate 100 may include P-type dopants (e.g., B, Al, Ga, In, Ta, another applicable P-type dopant, or a combination thereof). A first mask 102 is formed on the semiconductor substrate 100, in accordance with some embodiments. In some embodiments, the first mask 102 has a first opening 102a and a second opening 102b, and a portion of a top surface of the semiconductor substrate 100 is exposed through the first opening 102a and the second opening 102b.

In some embodiments, as shown in FIG. 1A, there is a distance S1 between the first opening 102a and the second opening 102b, and the distance S1 is above a portion 100a of the semiconductor substrate 100. When the distance S1 is too large, the N-type implant regions 104 and 106 (which will be discussed below) may not connect to each other after the heat treatment process (e.g., the heat treatment process A1 which will be discussed in the following paragraphs), degrading the performance of the semiconductor device. In some embodiments, the distance S1 is less than 12 μm (e.g., the distance S1 being in a range from 2 μm to 10 μm).

As shown in FIG. 1A, the first opening 102a may have a first width W1, and the second opening 102b may have a second width W2. The first width W1 may be the same as, greater than, or less than the second width W2. When the first width W1 is too large and the second width W2 is too small, the low-concentration doping portion of the subsequently formed N-type well region (e.g., the N-type well region 114 shown in FIG. 1K) may be too close to the N-type drain region (e.g., the N-type drain region 130 shown in FIG. 1K), which may result in non-uniform electric field distribution and thus degrade the performance of the semiconductor device. In some embodiments, the ratio of the first width W1 to the second width W2 (i.e., W1/W2) is in a range from 0.2 to 1.

In some embodiments, a spin-on coating process may be used to form a photoresist layer on the semiconductor substrate 100, and then a soft baking, exposure, post exposure baking and a developing process may be performed to pattern the photoresist layer, so as to form the first mask 102 having the first opening 102a and the second opening 102b. In some embodiments, the first mask 102 may be made of a hard mask material such as silicon oxide or silicon nitride, and the process for forming the first mask 102 may include a deposition process, a lithography process, an etching process, another applicable process, or a combination thereof.

Afterwards, a first N-type implant region 104 and a second N-type implant region 106 are formed in the semiconductor substrate 100, as shown in FIG. 1A in accordance with some embodiments. In a subsequent step, the first N-type implant region 104 and the second N-type implant region 106 may be used to form an N-type well region (e.g., the N-type well region 114 shown in FIG. 1D) in the semiconductor substrate 100, and the details will be discussed in the following paragraphs.

In some embodiments, the first N-type implant region 104 and the second N-type implant region 106 include N-type dopants (e.g., N, P, As, Sb, Bi, another applicable N-type dopant, or a combination thereof). For example, an ion implantation process may be used to implant the N-type dopants discussed above into the semiconductor substrate 100 to form the first N-type implant region 104 and the second N-type implant region 106 in the semiconductor substrate 100. In some embodiments, the first mask 102 may serve as an implant mask in the ion implantation process, and the N-type dopants discussed above may be implanted into the semiconductor substrate 100 through the first opening 102a and the second opening 102b of the first mask 102.

In some embodiments, as shown in FIG. 1A, the portion 100a of the semiconductor device 100 is between the first N-type implant region 104 and the second N-type implant region 106. In some embodiments, the first N-type implant region 104 and the second N-type implant region 106 are separated by the portion 100a of the semiconductor substrate 100.

Figure 1B:
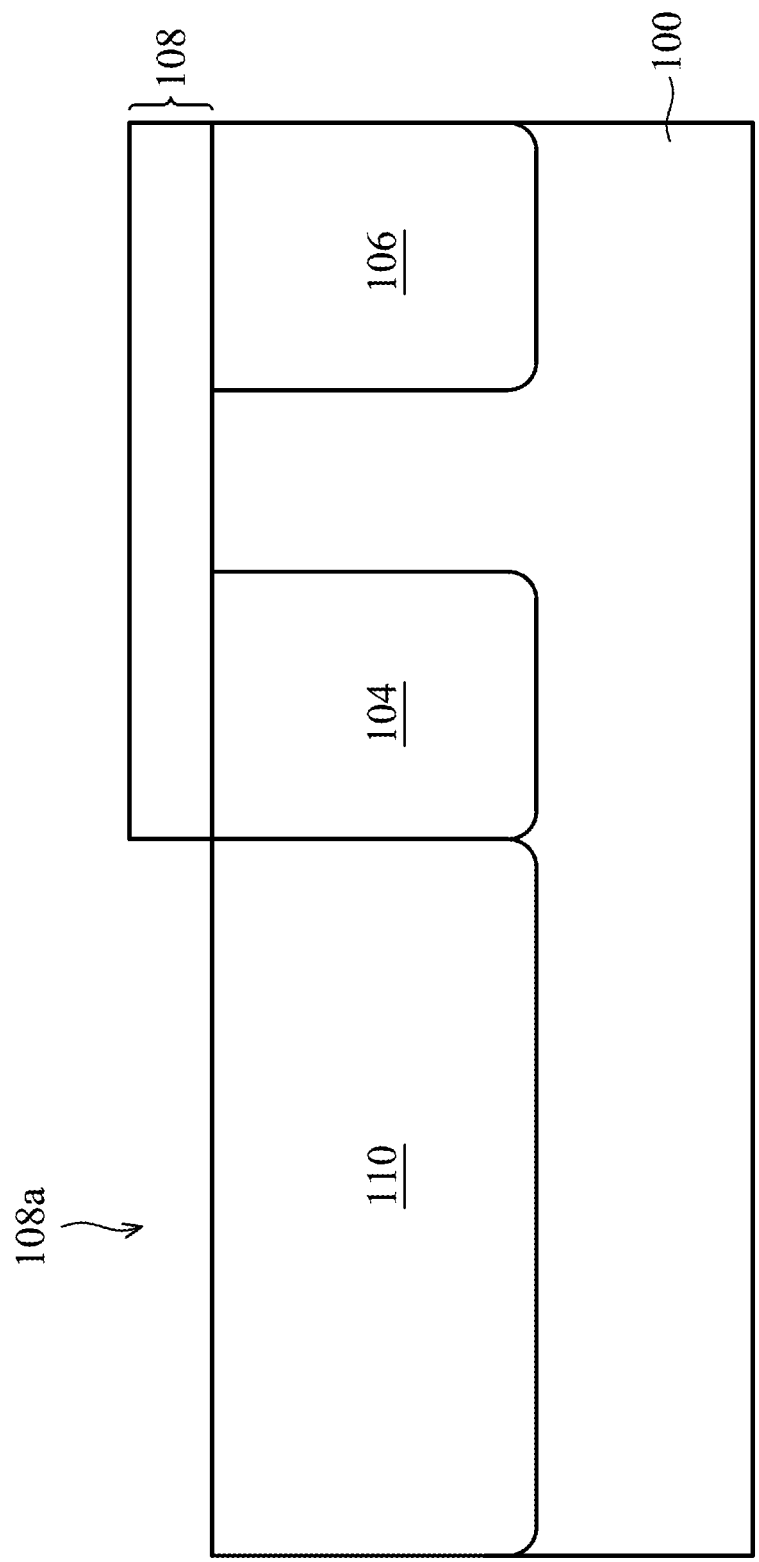

Afterwards, the first mask 102 is removed, as shown in FIG. 1B in accordance with some embodiments. In some embodiments, the first mask 102 is made of a photoresist, and thus a process such as a plasma ashing process can be used to remove the first mask 102. In some embodiments, the first mask 102 is made of a hard mask material (e.g., silicon oxide or silicon nitride), and thus an etching process can be used to remove the first mask 102.

Afterwards, a second mask 108 is formed on the semiconductor substrate 100, and the second mask 108 covers the first N-type implant region 104 and the second N-type implant region 106, as shown in FIG. 1B in accordance with some embodiments. In some embodiments, the second mask 108 has a third opening 108a, and a portion of the top surface of the semiconductor substrate 100 is exposed through the third opening 108a. The materials and the methods for forming the second mask 108 may be the same as or similar to those of the first mask 102 discussed above. In the interest of simplicity and clarity, the details will not be discussed again.

Afterwards, a first P-type implant region 110 is formed in the semiconductor substrate 100, as shown in FIG. 1B in accordance with some embodiments. In a subsequent process, the first P-type implant region 110 may be used to form a P-type well region (e.g., the P-type well region 112 shown in FIG. 1D) in the semiconductor substrate 100, and the details will be discussed in the following paragraphs.

In some embodiments, as shown in FIG. 1B, the first N-type implant region 104 is between the second N-type implant region 106 and the first P-type implant region 110. In some embodiments, as shown in FIG. 1B, the depth of the first P-type implant region 110 may be substantially the same as the depth of the first N-type implant region 104 and the depth of the second N-type implant region 106.

In some embodiments, the first P-type implant region 110 includes P-type dopants (e.g., B, Al, Ga, In, Ta, another applicable P-type dopant, or a combination thereof). For example, an ion implantation process may be used to implant the P-type dopants discussed above into the semiconductor substrate 100 to form the first P-type implant region 110 in the semiconductor substrate 100. In some embodiments, the second mask 102 may serve as an implant mask in the ion implantation process, and the P-type dopants discussed above may be implanted into the semiconductor substrate 100 through the third opening 108a of the second mask 108.

Figure 1C:
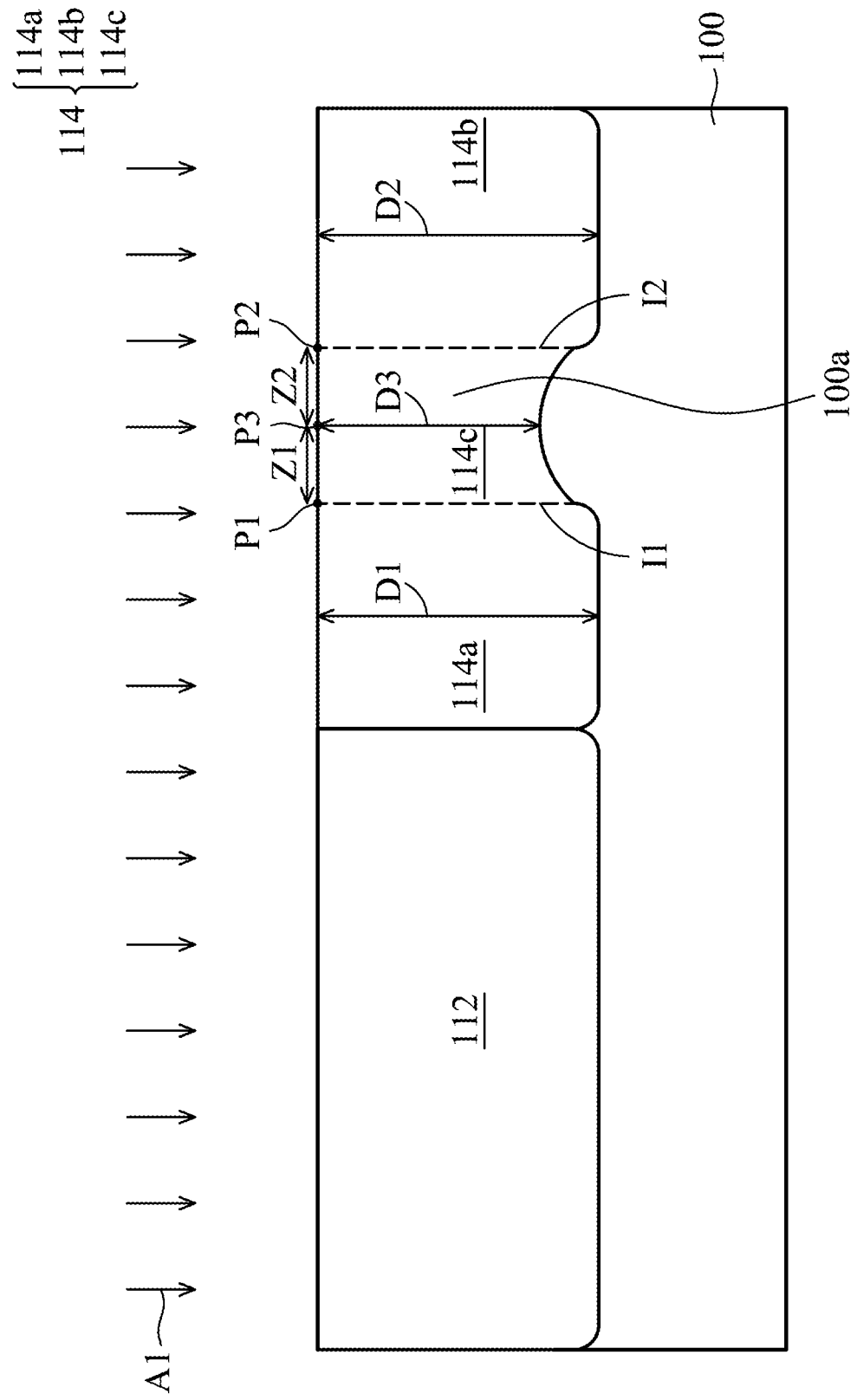
Figure 1C:
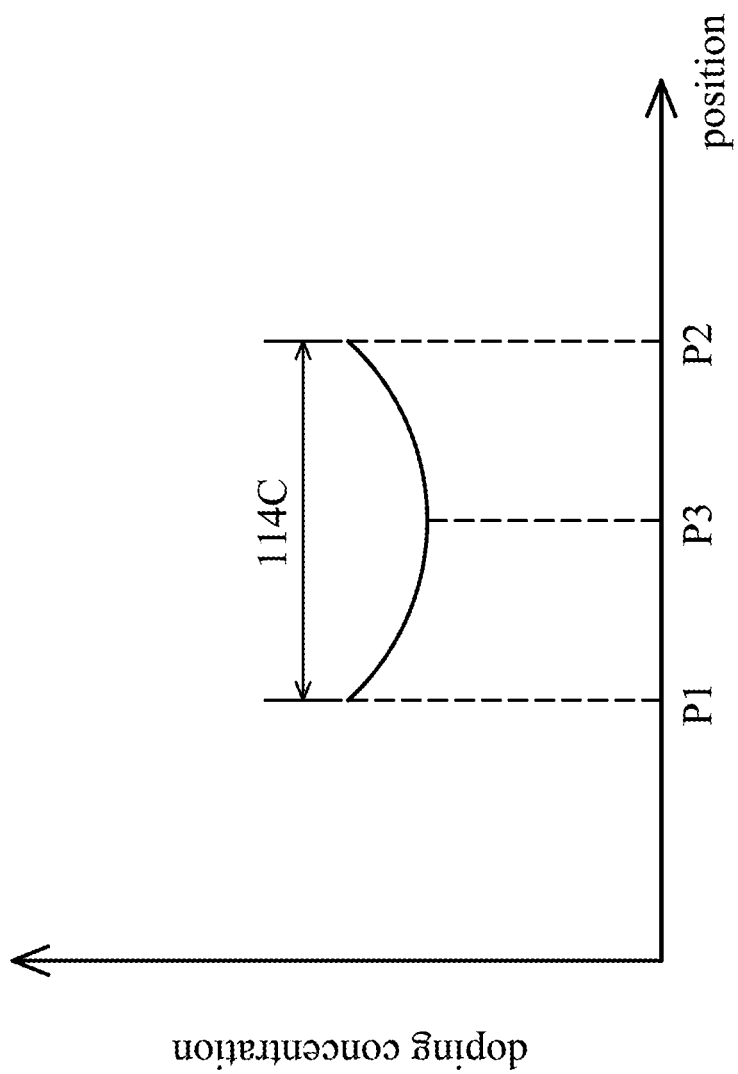

Afterwards, the mask 108 is removed, as shown in FIG. 1C in accordance with some embodiments. In some embodiments, the second mask 108 is made of a photoresist, and thus a process such as a plasma ashing process can be used to remove the second mask 108. In some embodiments, the second mask 108 is made of a hard mask material (e.g., silicon oxide or silicon nitride), and thus an etching process can be used to remove the second mask 108.

Afterwards, a heat treatment process A1 is performed on the semiconductor substrate 100, so as to form a P-type well region 112 and an N-type well region 114 adjacent to the P-type well region 112 in the semiconductor substrate 100, as shown in FIG. 1C in accordance with some embodiments. In some embodiments, the heat treatment process A1 can activate the P-type dopants in the first P-type implant region 110 and the N-type dopants in the first N-type implant region 104 and the second N-type implant region 106.

For example, the heat treatment process A1 may include a furnace annealing process, another applicable heat treatment process, or a combination thereof. In some embodiments, the heat treatment temperature of the heat treatment process A1 is in a range from 900° C. to 1250° C., and the corresponding heat treatment time (duration) is in a range from 120 minutes to 600 minutes.

In some embodiments, the doping concentration of the P-type well region 112 is greater than the doping concentration of the P-type semiconductor substrate 100. For example, the doping concentration of the P-type well region 112 may be in a range from $1E16$ $cm^{-3}$ to $1E18$ $cm^{-3}$.

In some embodiments, as shown in FIG. 1C, the N-type well region 114 has a first portion 114a, a second portion 114b, and a third portion 114c. In some embodiments, the first portion 114a of the N-type well region 114 is between the P-type well region 112 and the third portion 114c of the N-type well region 114, and the third portion 114c of the N-type well region 114 is between the first portion 114a and the second portion 114b of the N-type well region 114.

In some embodiments, the first portion 114a of the N-type well region 114 corresponds to the first N-type implant region 104, the second portion 114b of the N-type well region 114 corresponds to the second implant region 106, and the third portion 114c of the N-type well region 114 corresponds to the portion 100a of the semiconductor substrate 100. As shown in FIG. 1C, there may be a first interface I1 between the first portion 114a and the third portion 114c of the N-type well region 114, and there may be a second interface I2 between the second portion 114b and the third portion 114c of the N-type well region 114.

In some embodiments, the doping concentration (e.g., the average doping concentration) of the third portion 114c of the N-type well region 114 is lower than the doping concentration of the first portion 114a of the N-type well region 114 and the doping concentration of the second portion 114b of the N-type well region 114. In some embodiments, as shown in FIG. 1C, some of the N-type dopants in the first N-type implant region 104 and the second N-type implant region 106 are diffused into the portion 100a of the semiconductor substrate 100 through the heat treatment process A1. As a result, the N-type well region 114 has high-concentration doping portions (e.g., the first portion 114a and the second portion 114b) and a low-concentration doping portion (e.g., the third portion 114c) between these high-concentration doping portions.

In some embodiments, since the N-type well region 114 has the low-concentration doping portion (e.g., the third portion 114c) and the high-concentration doping portions (e.g., the first portion 114a and the second portion 114b) at opposite sides of the low-concentration doping portion, the resulting semiconductor device (e.g., the semiconductor device 10 which will be discussed in the following paragraphs) has a higher breakdown voltage. For example, the doping concentration of the third portion 114c of the N-type well region 114 may be in a range from $1E16$ $cm^{-3}$ to $1E18$ $cm^{-3}$, the doping concentration of the first portion 114a of the N-type well region 114 may be in a range from $2E16$ $cm^{-3}$ to $5E18$ $cm^{-3}$, and the doping concentration of the second portion 114b of the N-type well region 114 may be in a range from $2E16$ $cm^{-3}$ to $5E18$ $cm^{-3}$.

As discussed above, in some embodiments, only a single implant mask (i.e., the first mask 102) is used in the ion implantation process for forming the first N-type implant region 104 and the second N-type implant region 106 that are separated by the portion 100a of the semiconductor substrate 100. In other words, in these embodiments, the N-type well region 114 having the low-concentration doping portion (e.g., the third portion 114c) and the high-concentration doping portions (e.g., the first portion 114a and the second portion 114b) at opposite sides of the low-concentration doping portion can be formed without using additional implant masks, reducing the manufacturing cost of the semiconductor device.

In some embodiments, some of the N-type dopants in the first N-type implant region 104 and the second N-type implant region 106 are diffused into the portion 100a of the semiconductor substrate 100 by the heat treatment process A1 to form the third portion 114c of the N-type well region 114, so that the doping concentration of the third portion 114c of the N-type well region 114 gradually decreases from the first interface I1 and the second interface I2 to the center region of the third portion 114c of the N-type well region 114. For example, in some embodiments, as shown in FIGS. 1C and 1C', the doping concentration of the third portion 114c of the N-type well region 114 gradually decreases from a position P1 and a position P2 toward a position P3 to a minimum value. In some embodiments, the position P1 is at the first interface I1, the position P2 is at the second interface I2, there is a distance Z1 between the position P1 and the position P3, there is a distance Z2 between the position P2 and the position P3, and the distance Z1 is less than or substantially the same as the distance Z2 (e.g., the ratio of the distance Z1 to the distance Z2 (i.e., Z1/Z2) is in a range from 0.3 to 1).

As shown in FIG. 1C, the first portion 114a of the N-type well region 114 may have a depth D1, the second portion 114b of the N-type well region 114 may have a depth D2, and the third portion 114c of the N-type well region 114 may have a depth D3. In some embodiments, the depth D1 and the depth D2 is greater than the depth D3. In some embodiments, as shown in FIG. 1C, the depth of the third portion 114c of the N-type well region 114 gradually decreases from the first interface I1 and the second interface I2 to the center region of the third portion 114c of the N-type well region 114. In some embodiments, the third portion 114c of the N-type well region 114 has a concave bottom contour.

Figure 1D:
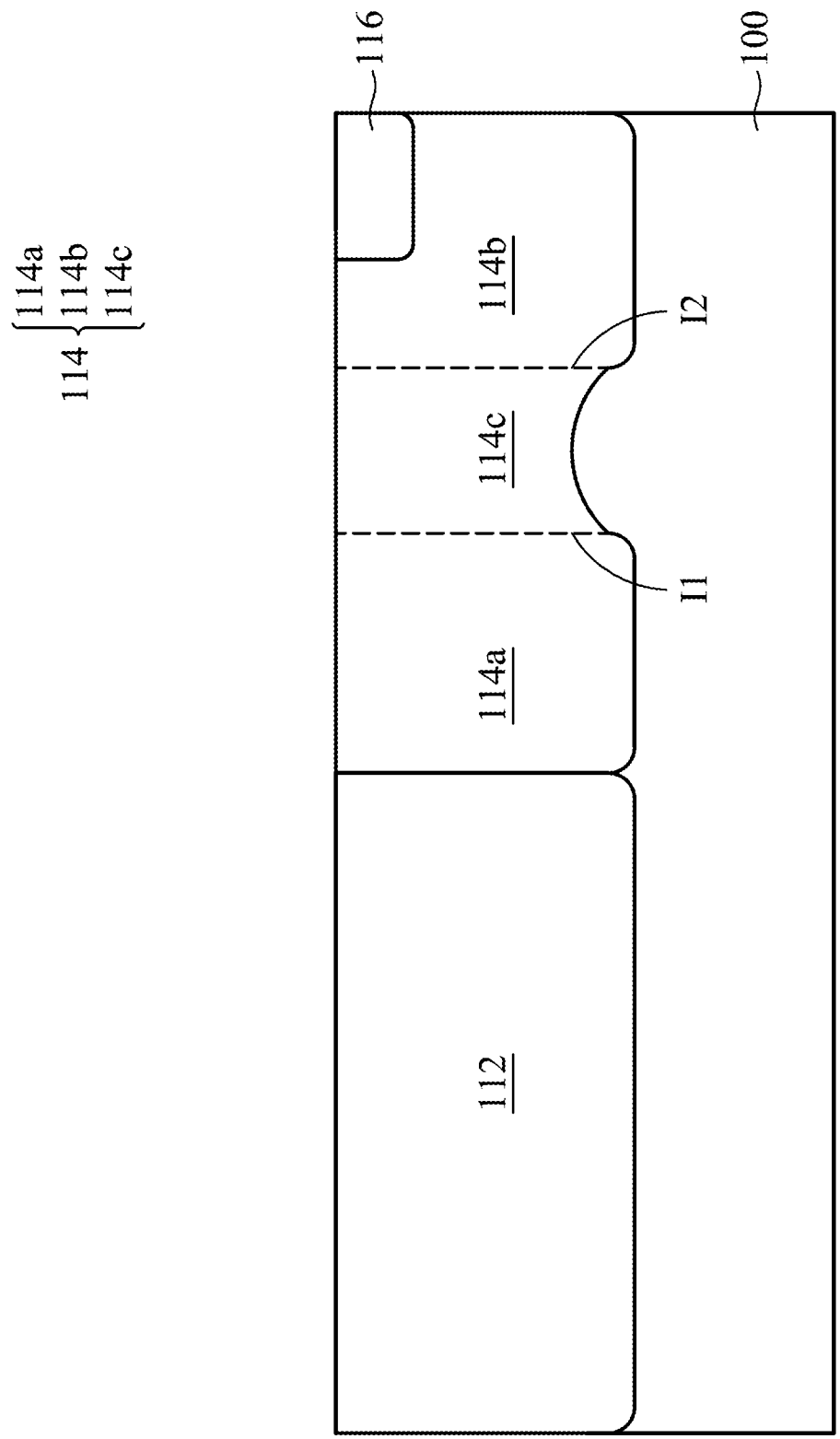

Afterwards, an N-type doping region 116 is formed in the N-type well region 114, as shown in FIG. 1D in accordance with some embodiments. In some embodiments, the N-type doping region 116 is in the second portion 114b of the N-type well region 114. The doping concentration of the N-type doping region 116 may be greater than the doping concentration of the second portion 114b of the N-type well region 114. For example, the doping concentration of the N-type doping region 116 may be in a range from $5E17$ $cm^{-3}$ to $1E19$ $cm^{-3}$. For example, the step for forming the N-type doping region 116 may include an ion implantation process, a heat treatment process, another applicable process, or a combination thereof.

Figure 1E:
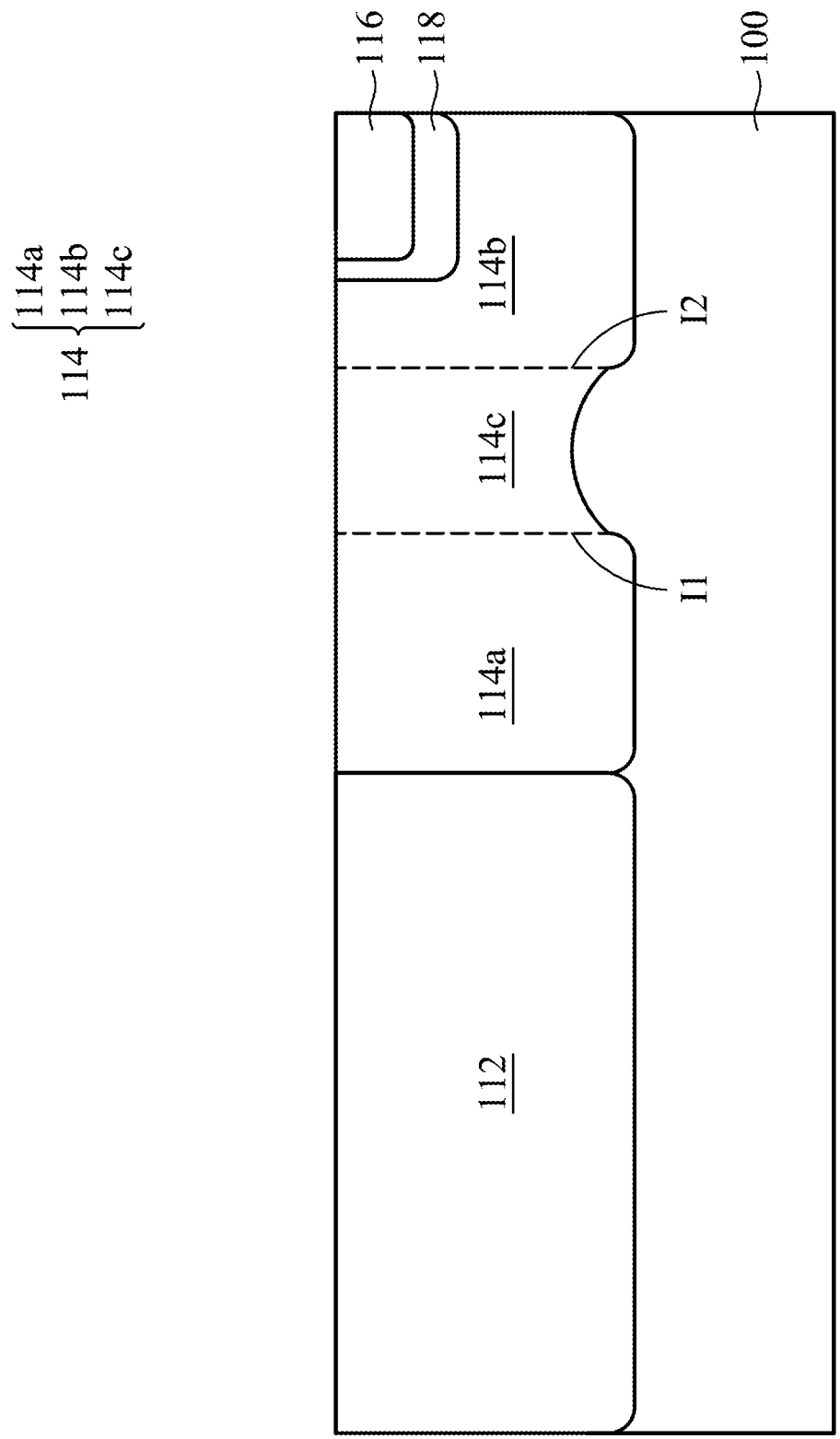

Afterwards, an N-type doping region 118 is formed in the N-type well region 114, as shown in FIG. 1E in accordance with some embodiments. The doping concentration of the N-type doping region 118 may be greater than the doping concentration of the second portion 114b of the N-type well region 114 and may be less than the doping concentration of the N-type doping region 116. For example, the doping concentration of the N-type doping region 118 may be in a range from $1E17$ $cm^{-3}$ to $8E18$ $cm^{-3}$. For example, the step for forming the N-type doping region 118 may include an ion implantation process, a heat treatment process, another applicable process, or a combination thereof.

Figure 1F:
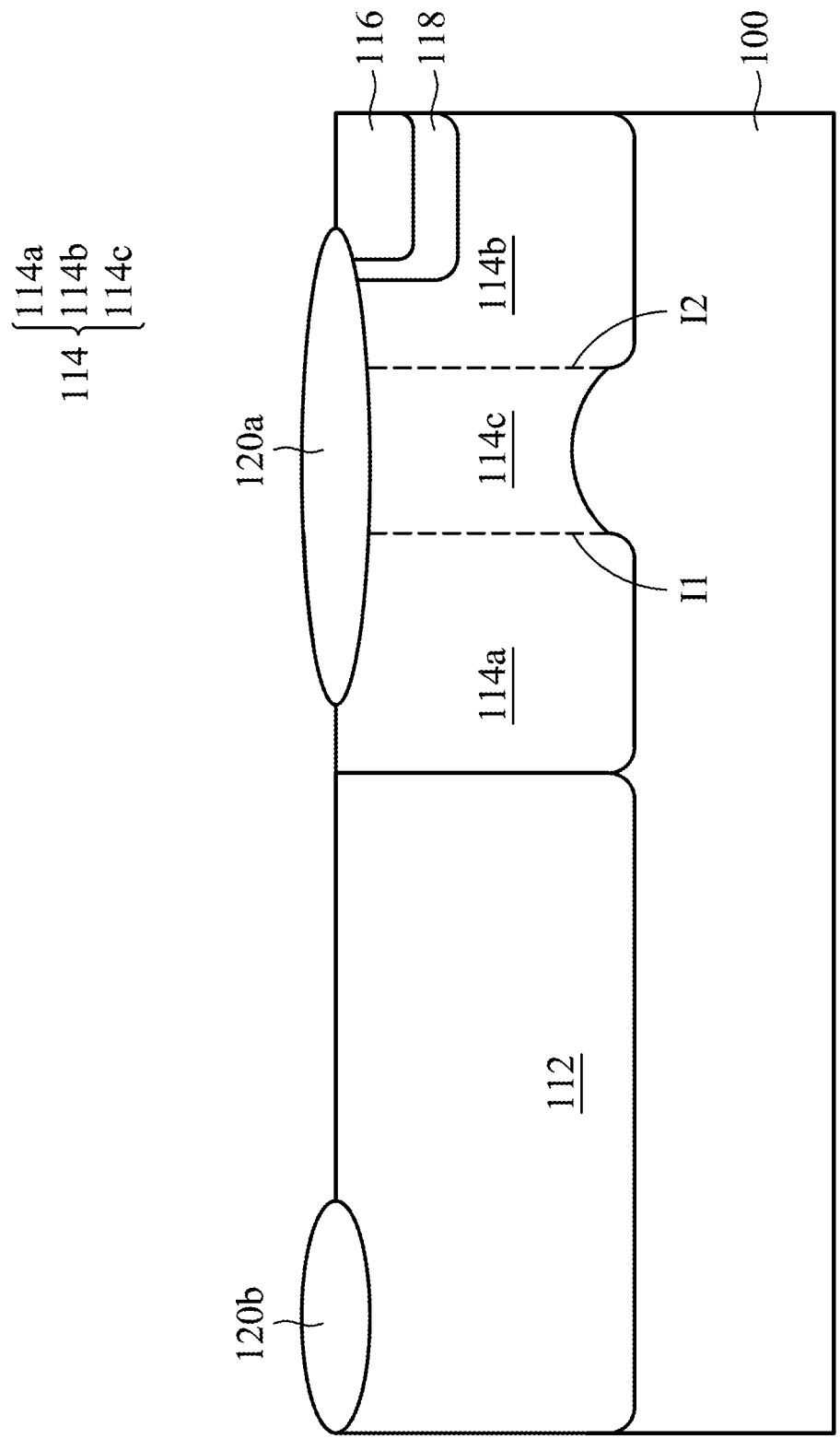

Afterwards, an oxide 120a and an oxide 120b are formed on the top surface of the semiconductor substrate 100, as shown in FIG. 1F in accordance with some embodiments. In some embodiments, the oxide 120a and the oxide 120b are field oxides. In some embodiments, as shown in FIG. 1F, the oxide 120a covers the N-type well region 114, and the oxide 120b covers the P-type well region 112. In some embodiments, as shown in FIG. 1F, the oxide 120a fully covers the third portion 114c of the N-type well region 114. In some embodiments, as shown in FIG. 1F, the oxide 120a only partially covers the first portion 114a and the second portion 114b of the N-type well region 114. For example, the oxide 120a and the oxide 120b may be silicon oxide, and a local oxidation of silicon (LOCOS) process may be applied to form the oxide 120a and the oxide 120b.

Figure 1G:
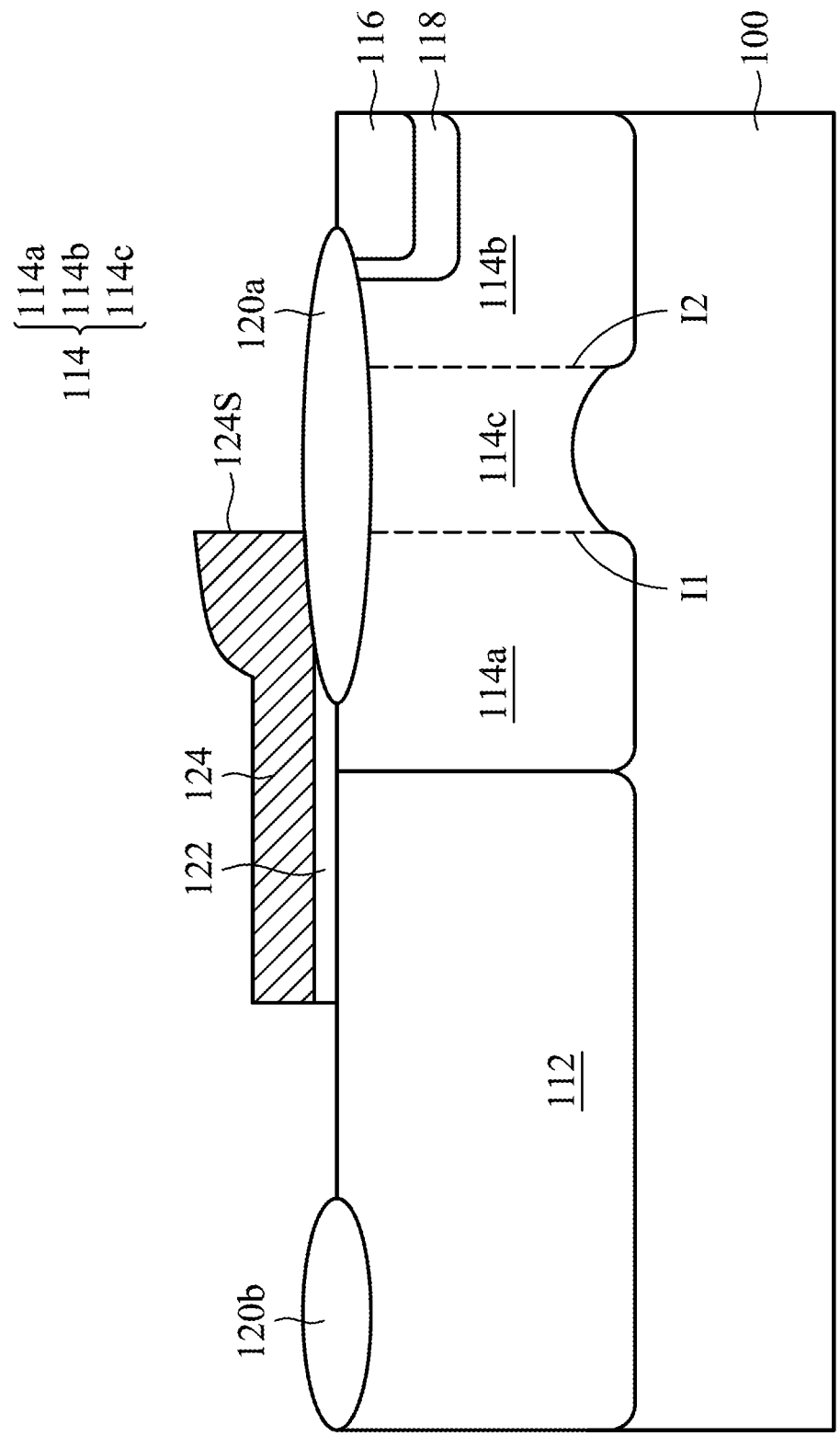

Afterwards, a gate dielectric layer 122 is formed on the top surface of the semiconductor substrate 100, and a gate electrode 124 is formed on the gate dielectric layer 122, as shown in FIG. 1G in accordance with some embodiments. The gate dielectric layer 122 and the gate electrode 124 may partially cover the N-type well region 114 and the P-type well region 112.

As shown in FIG. 1G, the gate electrode 124 may have a sidewall 124S. In some embodiments, as shown in FIG. 1G, the sidewall 124S of the gate electrode 124 is substantially aligned with the first interface I1 and is adjacent to the third portion 114c (which has low doping concentration) of the N-type well region 114, so that the electric field in the vicinity of the sidewall 124S of the gate electrode 124 can be reduced, increasing the breakdown voltage of the semiconductor device. In some embodiments, the sidewall 124S of the gate electrode 124 is coplanar with the first interface I1.

For example, the gate dielectric layer 122 may be made of silicon oxide, silicon nitride, silicon oxynitride, high-k dielectric materials, another applicable dielectric material, or a combination thereof. In some embodiments, the step for forming the gate dielectric layer 122 may include a deposition process, a lithography process, an etching process, another applicable process, or a combination thereof.

For example, the gate electrode layer 124 may be made of poly-silicon, a metal (e.g., W, Ti, Al, Cu, Mo, Ni, Pt, another applicable metal, or a combination thereof), a metal alloy, a metal nitride, a metal silicide, a metal oxide, another applicable conductive material, or a combination thereof. In some embodiments, the step for forming the gate electrode 124 may include a deposition process, a lithography process, an etching process, another applicable process, or a combination thereof.

Figure 1H:
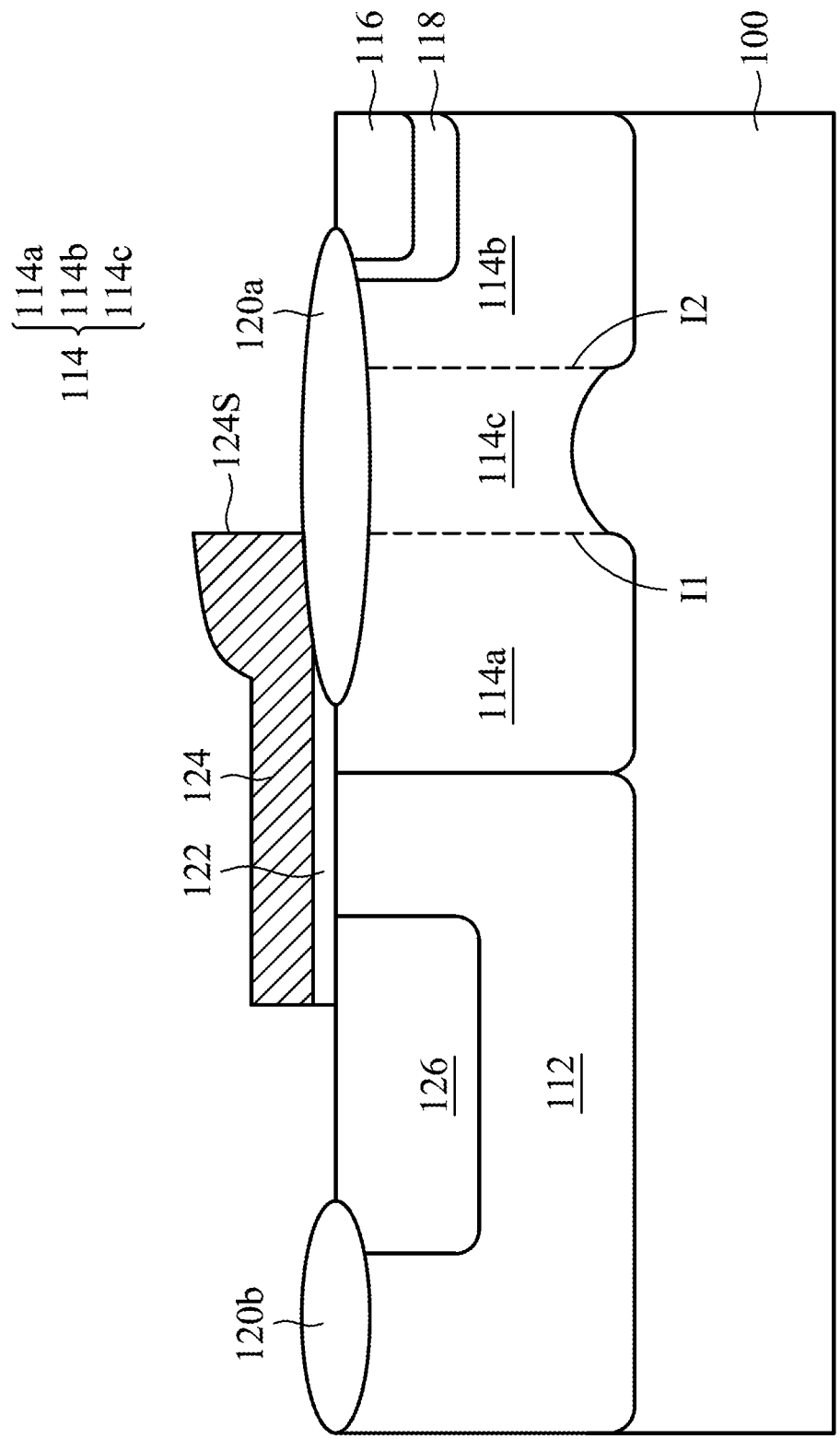

Afterwards, a P-type doping region 126 is formed in the P-type well region 112, as shown in FIG. 1H in accordance with some embodiments. The doping concentration of the P-type doping region 126 may be greater than the doping concentration of the P-type well region 112. For example, the doping concentration of the P-type doping region 126 may be in a range from $1E17$ $cm^{-3}$ to $5E18$ $cm^{-3}$. For example, the step for forming the P-type doping region 126 may include an ion implantation process, a heat treatment process, another applicable process, or a combination thereof.

Figure 1I:
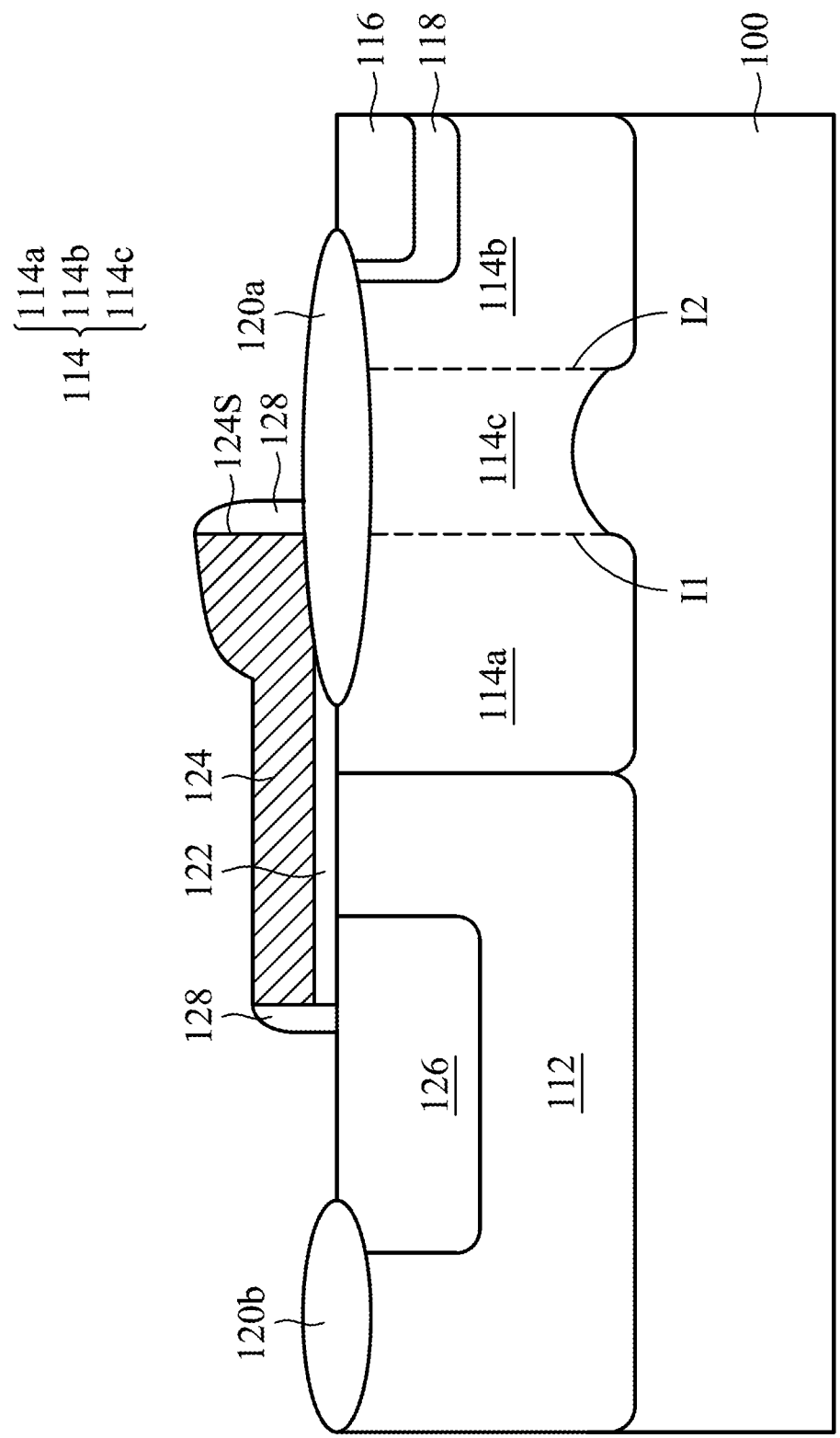

Afterwards, gate sidewall spacers 128 are formed on sidewalls of the gate dielectric layer 122 and the gate electrode 124, as shown in FIG. 1I in accordance with some embodiments. For example, the gate sidewall spacers 128 may be made of an insulating material (e.g., $SiO_2$, SiN, SiON, another applicable insulating material, or a combination thereof). For example, a blanket layer of an insulating material may be formed on the top surface of the semiconductor substrate 100 using a chemical vapor deposition process or other applicable processes, and then the blanket layer of the insulating material may be anisotropically etched to form the gate sidewall spacers 128 on the sidewalls of the gate dielectric layer 122 and the gate electrode 124.

Figure 1J:
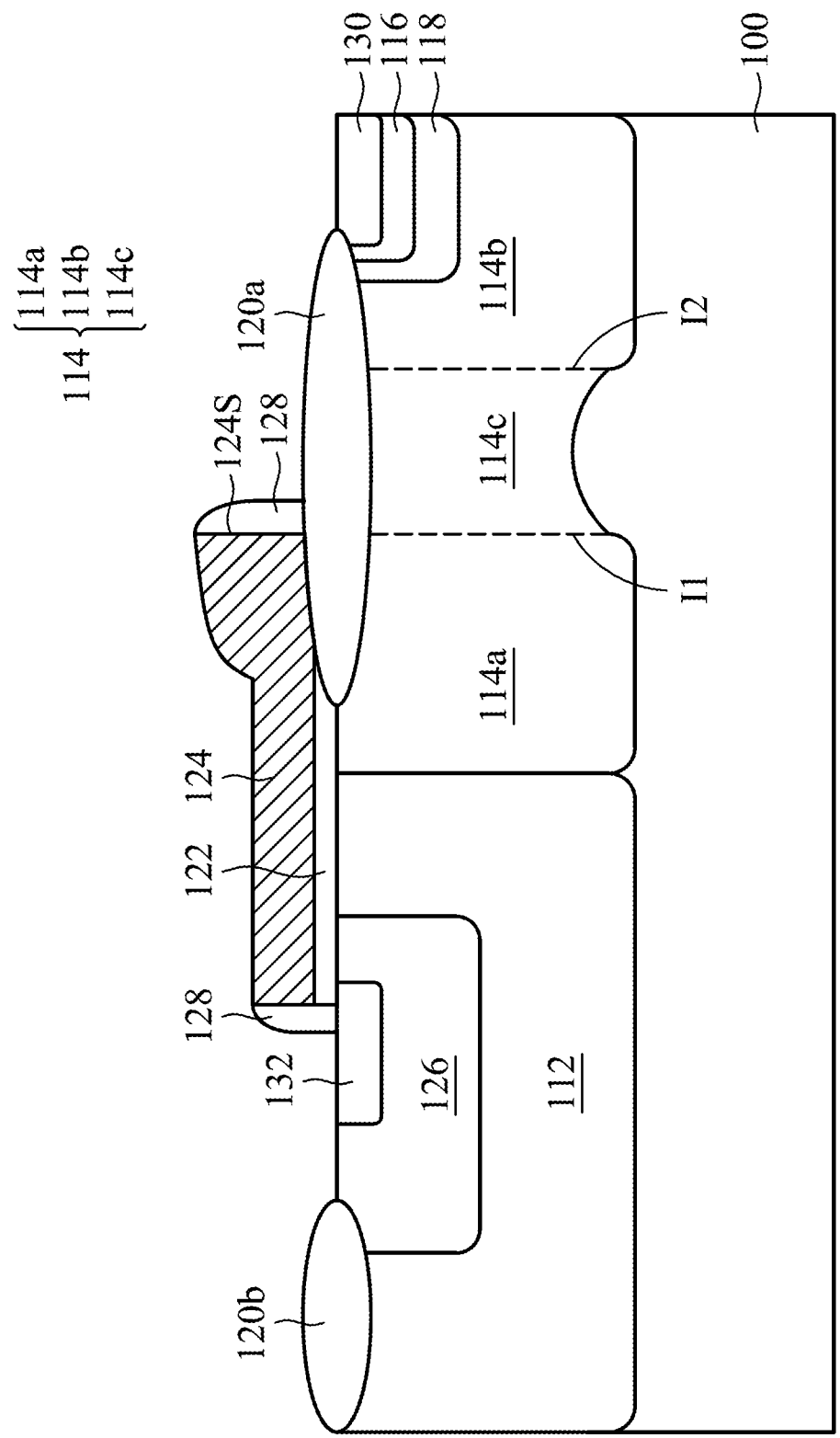

Afterwards, an N-type drain region 130 is formed in the N-type well region 114, and an N-type source region 132 is formed in the P-type well region 112, as shown in FIG. 1J in accordance with some embodiments. In some embodiments, as shown in FIG. 1J, the N-type source region 132 is formed in the P-type doping region 126, and the N-type drain region 130 is formed in the N-type doping region 116.

In some embodiments, a portion of the N-type source region 132 is underneath the gate electrode 124 and the gate dielectric layer 122.

For example, the doping concentration of the N-type drain region 130 and the doping concentration of the N-type source region 132 may each be in a range from $5E19$ $cm^{-3}$ to $1E21$ $cm^{-3}$. For example, the step for forming the N-type drain region 130 and the N-type source region 132 may include an ion implantation process, a heat treatment process, another applicable process, or a combination thereof. In some embodiments, the doping concentration of the N-type drain region 130 is greater than the doping concentration of the N-type doping region 116 and the doping concentration of the N-type doping region 118. In some embodiments, the N-type doping region 118 surrounds the sidewall and the bottom surface of the N-type drain region 130.

Figure 1K:
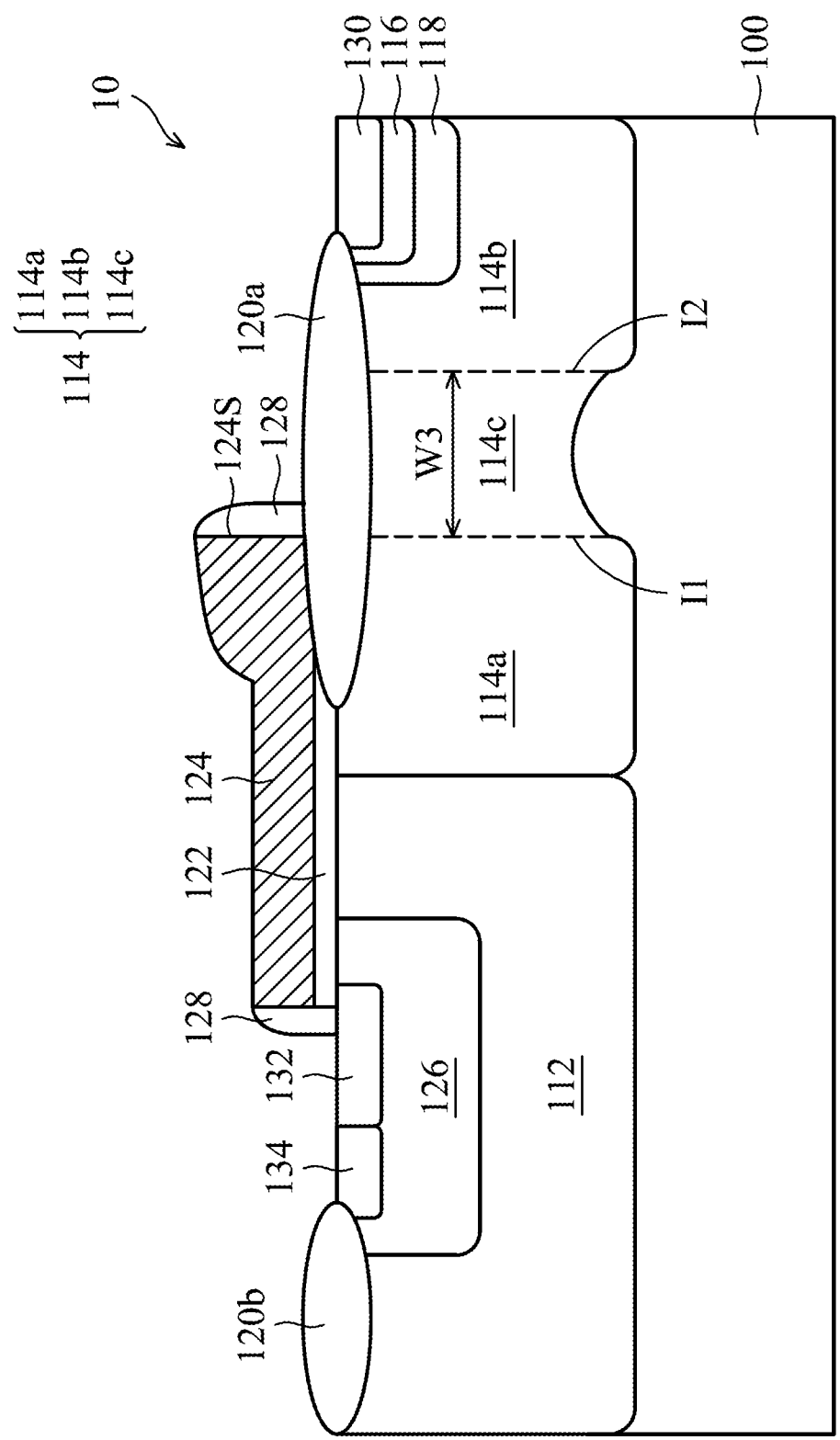

Afterwards, a P-type doping region 134 is formed in the P-type well region 112, so as to form a semiconductor device 10, as shown in FIG. 1K in accordance with some embodiments. In some embodiments, the P-type doping region 134 is in the P-type doping region 126, and the doping concentration of the P-type doping region 134 is greater than the doping concentration of the P-type doping region 126. For example, the doping concentration of the P-type doping region 134 may be in a range from $5E19$ $cm^{-3}$ to $1E21$ $cm^{-3}$. For example, the step for forming the P-type doping region 134 may include an ion implantation process, a heat treatment process, another applicable process, or a combination thereof. In some embodiments, the P-type doping region 134 is in direct contact with the N-type source region 132.

As shown in FIG. 1K, the N-type well region 114 of the semiconductor device 10 of embodiments of the present disclosure has the low-concentration doping portion (e.g., the third portion 114c) and the high-concentration doping portions (e.g., the first portion 114a and the second portion 114b) at opposite sides of the low-concentration doping portion, so that the breakdown voltage may be increased. In some embodiments, the breakdown voltage of the semiconductor device 10 is in a range from 80 volts to 200 volts.

As shown in FIG. 1K, the third portion 114c of the N-type well region 114 of the semiconductor device 10 may have a width W3. When the width W3 is too large, the doping concentration of the N-type well region 114c may be too low, increasing the on-resistance and degrading the performance of the semiconductor device 10. In some embodiments, the width W3 is smaller than 10 μm (e.g., the width W3 being in a range from 1 μm to 8 μm).

In summary, according to some embodiments of the present disclosure, the N-type well region 114 of the semiconductor device 10 has the first portion 114a, the second portion 114b, and the third portion 114c that is between the first portion 114a and the second portion 114b, and the doping concentration of the third portion 114c of the N-type well region 114 is lower than the doping concentration of the first portion 114a of the N-type well region 114 and the doping concentration of the second portion 114b of the N-type well region 114, so that the breakdown voltage of the semiconductor device 10 can be increased. In addition, according to some embodiments of the present disclosure, the first N-type implant region 104 and the second N-type implant region 106 that are separated from each other by a portion of the semiconductor substrate 100 are formed in the semiconductor substrate 100 by performing an ion implantation process using a single implant mask (i.e., the first mask 102), so that the first portion 114a, the second portion 114b and the third portion 114c of the N-type well region 114 can be formed without using additional implant masks. Therefore, the performance of the semiconductor device 10 can be improved without increasing the manufacturing cost.

Figure 2:
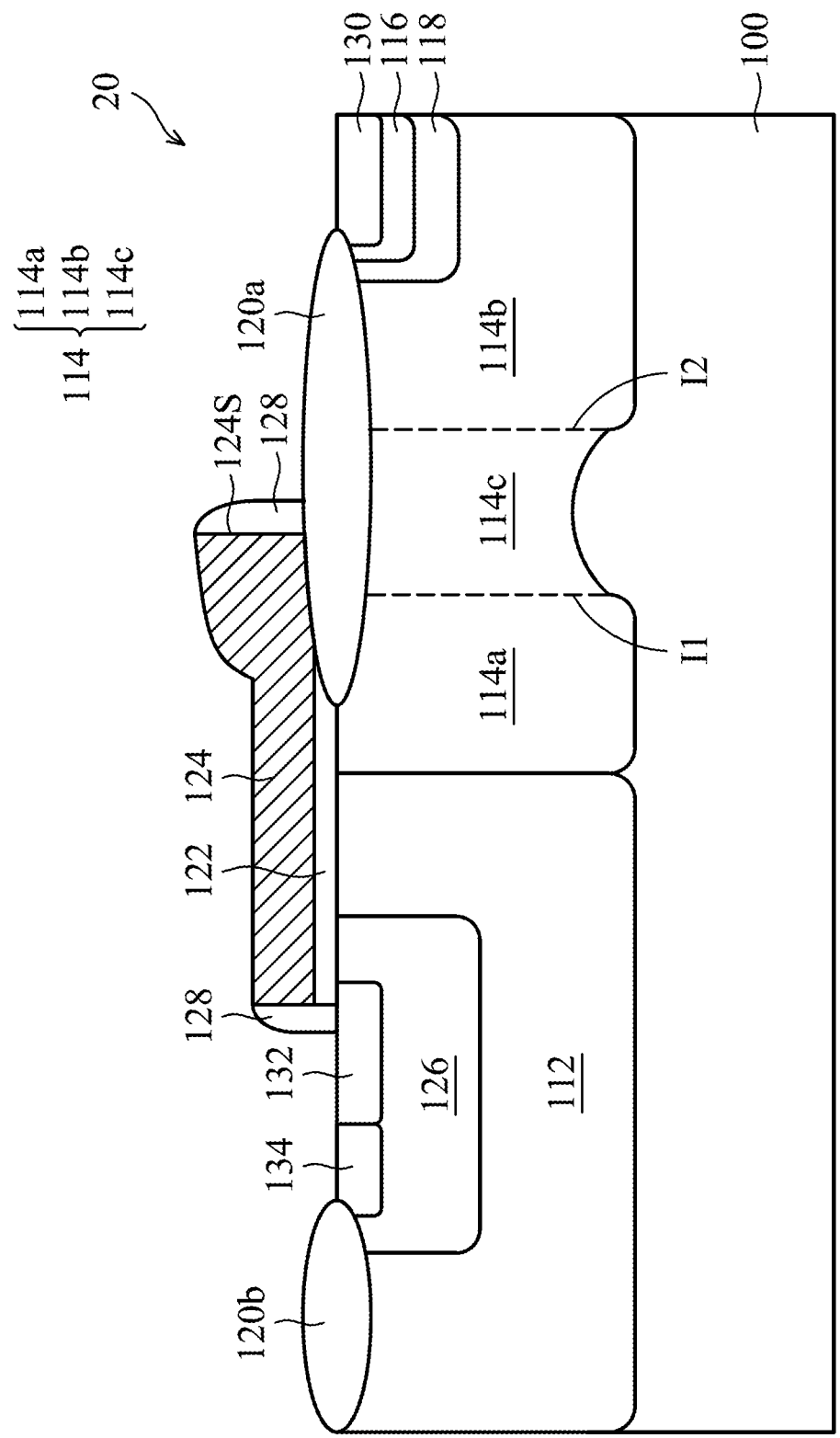
FIG. 2 illustrates a cross-sectional view of a semiconductor device, in accordance with some embodiments of the present disclosure.

FIG. 2 illustrates a cross-sectional view of a semiconductor device 20 of some embodiments of the present disclosure. One difference between the semiconductor device 10 and the semiconductor device 20 is that the first interface I1 of the semiconductor device 20 is laterally spaced apart from the sidewall 124S of the gate electrode 124. In some embodiments, as shown in FIG. 2, the gate electrode 124 partially covers the third portion 114c of the N-type well region 114.

Figure 3:
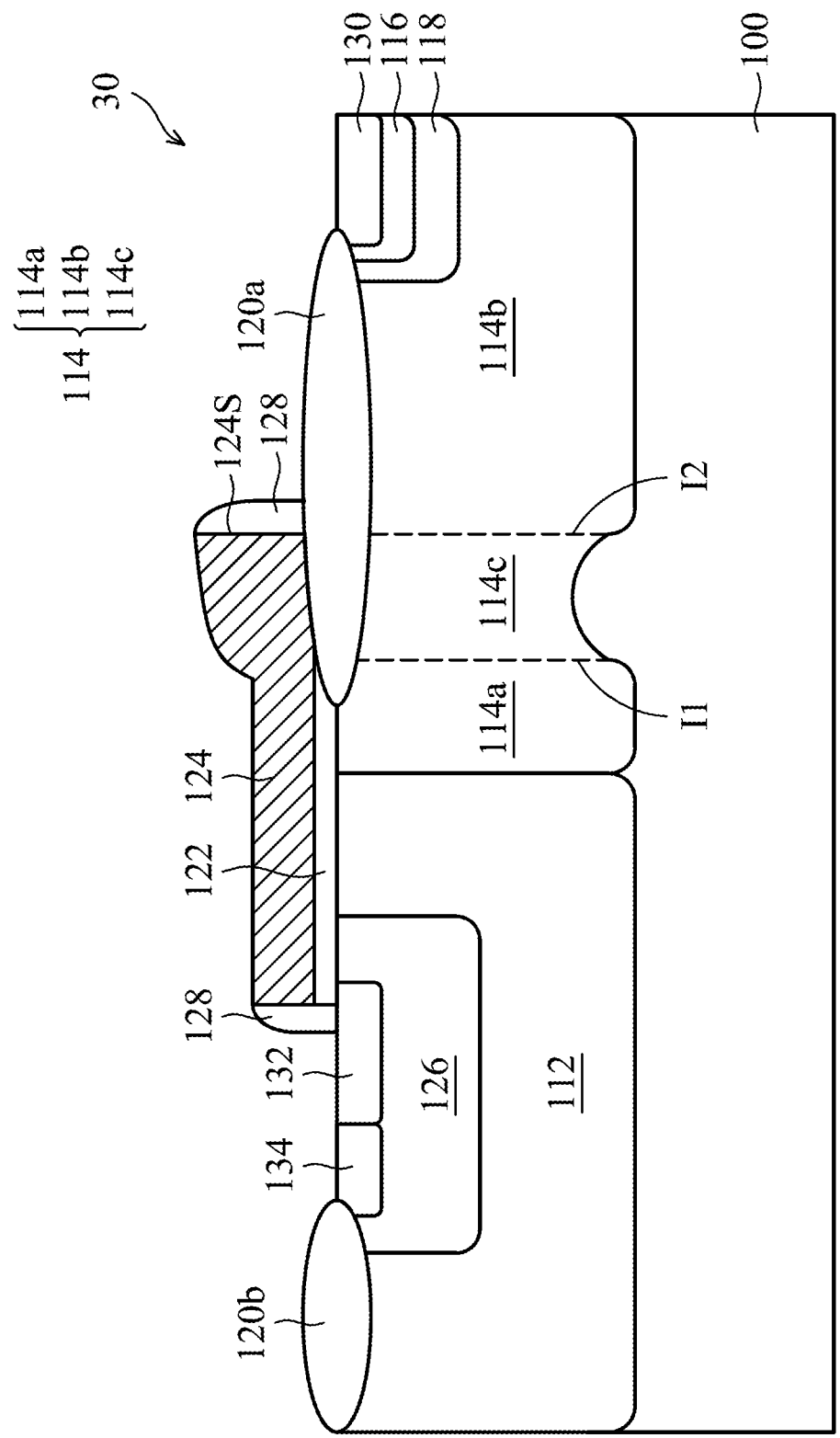
FIG. 3 illustrates a cross-sectional view of a semiconductor device, in accordance with some embodiments of the present disclosure.

FIG. 3 illustrates a cross-sectional view of a semiconductor device 30 of some embodiments of the present disclosure. One difference between the semiconductor device 10 and the semiconductor device 30 is that the second interface I2 of the semiconductor device 30 is aligned with the sidewall 124S of the gate electrode 124. In some embodiments, the second interface I2 and the sidewall 124S of the gate electrode 124 are coplanar. In some embodiments, as shown in FIG. 3, the gate electrode 124 fully covers the third portion 114c of the N-type well region 114.

Figure 4:
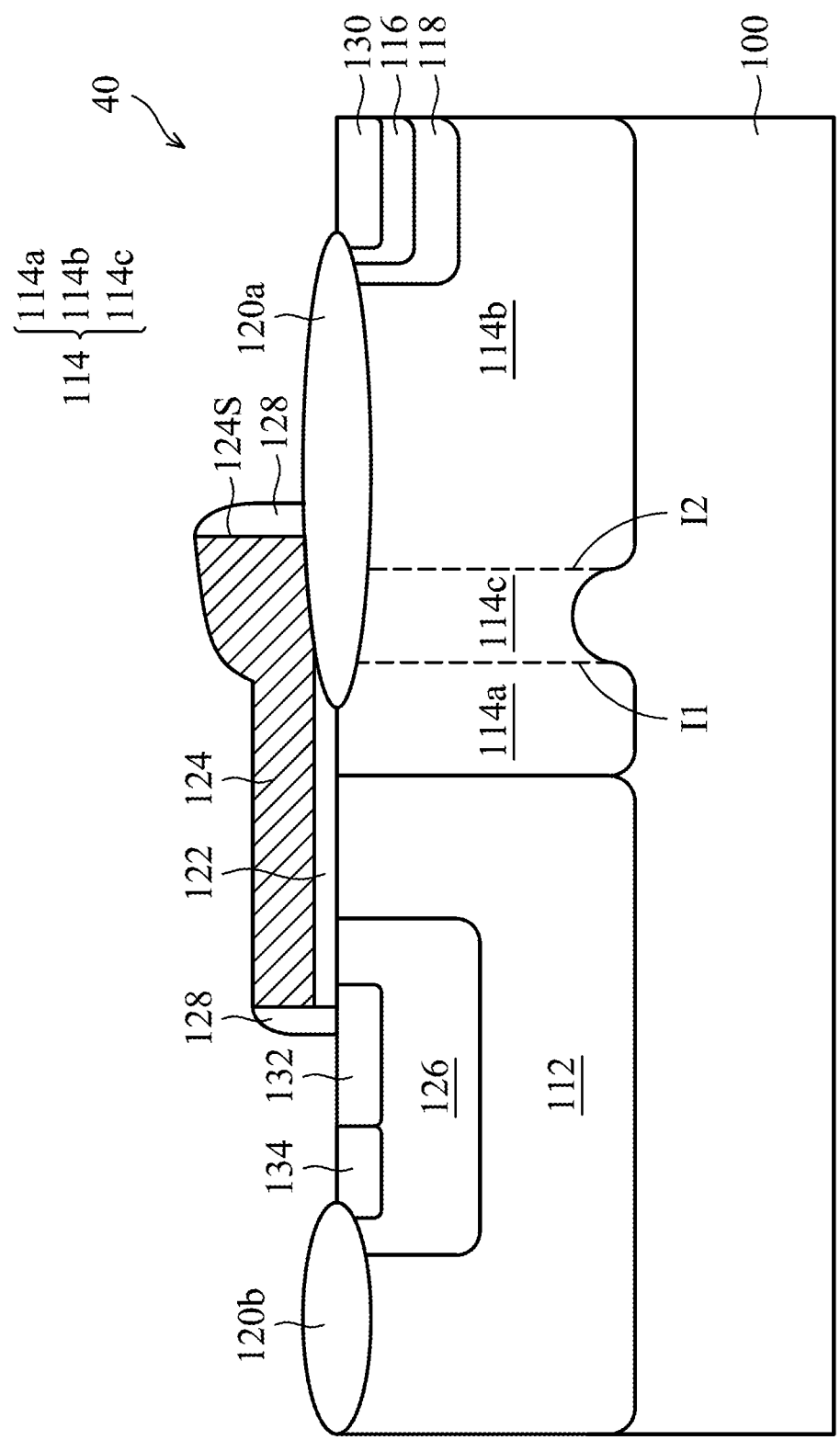
FIG. 4 illustrates a cross-sectional view of a semiconductor device, in accordance with some embodiments of the present disclosure.

FIG. 4 illustrates a cross-sectional view of a semiconductor device 40 of some embodiments of the present disclosure. One difference between the semiconductor device 10 and the semiconductor device 40 is that the first interface I1 of the semiconductor device 40 is laterally spaced apart from the sidewall 124S of the gate electrode 124. In some embodiments, as shown in FIG. 4, the second interface I2 is laterally spaced apart from the sidewall 124S of the gate electrode 124, and the gate electrode 124 fully covers the third portion 114c of the N-type well region 114.

Figure 5:
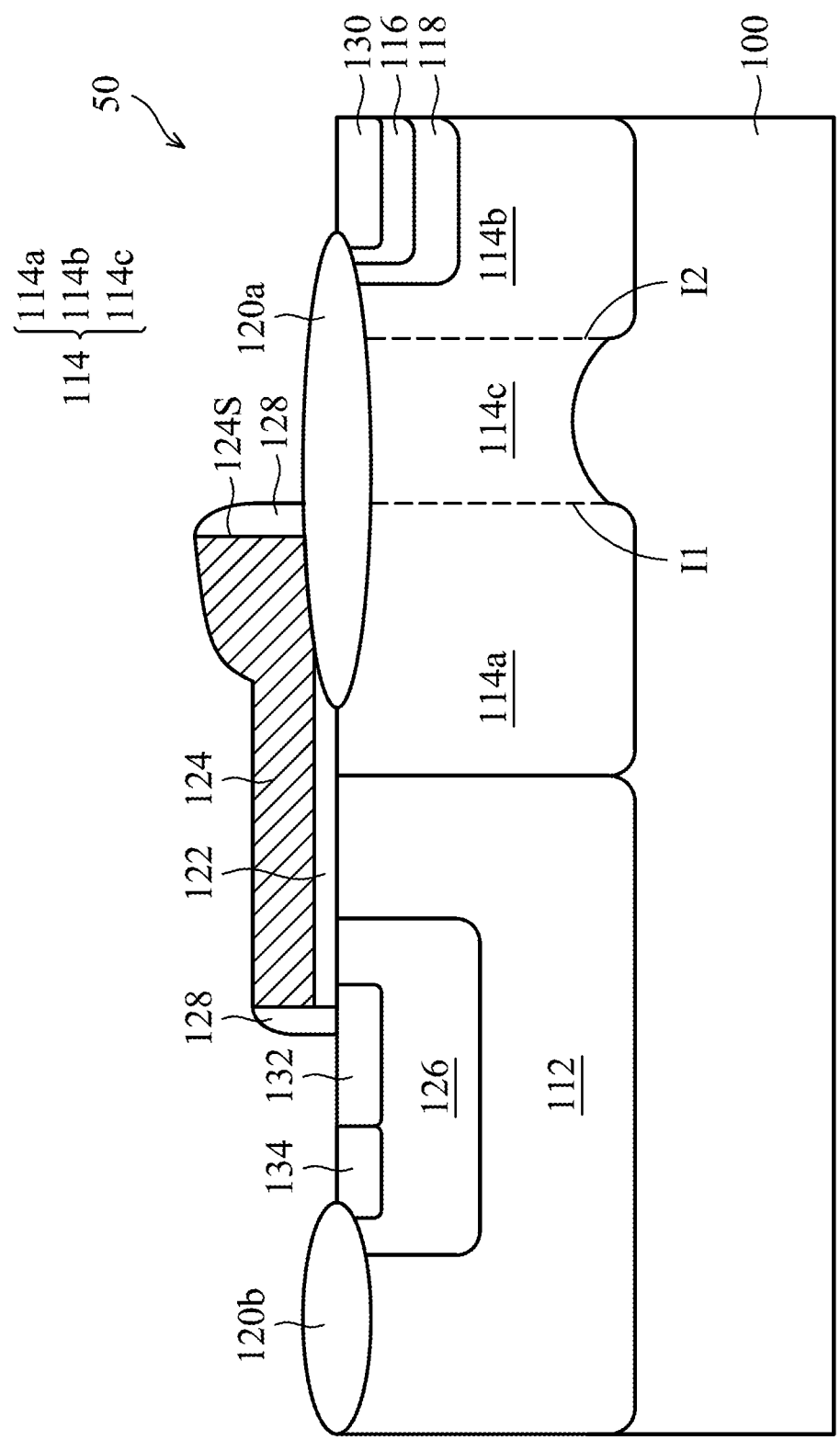
FIG. 5 illustrates a cross-sectional view of a semiconductor device, in accordance with some embodiments of the present disclosure.

FIG. 5 illustrates a cross-sectional view of a semiconductor device 50 of some embodiments of the present disclosure. One difference between the semiconductor device 10 and the semiconductor device 50 is that the first interface I1 of the semiconductor device 50 is laterally spaced apart from the sidewall 124S of the gate electrode 124. In some embodiments, as shown in FIG. 5, the second interface I2 is laterally spaced apart from the sidewall 124S of the gate electrode 124, and the gate electrode 124 does not cover the third portion 114c of the N-type well region 114. In some embodiments, as shown in FIG. 5, the first interface I1 is aligned with the sidewall of the gate sidewall spacer 128.

In summary, according to embodiments of the present disclosure, the N-type well region of the semiconductor device has a low-concentration doping portion and high-concentration doping portions at opposite sides of the low-concentration doping portion, so that the breakdown voltage of the semiconductor device can be increased. In addition, according to embodiments of the present disclosure, the first N-type implant region and the second N-type implant region that are separated from each other by a portion of the semiconductor substrate are formed in the semiconductor substrate by performing an ion implantation process using a single implant mask, so that the first portion, the second portion and the third portion of the N-type well region discussed above can be formed without using additional implant masks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. In addition, although several embodiments are discussed above as examples in the present disclosure, they are not intended to be limiting. Furthermore, not all advantages of the present disclosure are necessarily discussed herein, and other embodiments may offer different advantages, and that no particular advantage is required for any embodiment.

What is claimed is:

1. A method for forming a semiconductor device, comprising:
    providing a semiconductor substrate;
    forming a first N-type implant region and a second N-type implant region in the semiconductor substrate, wherein the first N-type implant region and the second N-type implant region are separated by a portion of the semiconductor substrate;
    forming a first P-type implant region in the semiconductor substrate, wherein the first N-type implant region is between the second N-type implant region and the first P-type implant region;
    performing a heat treatment process on the semiconductor substrate to form an N-type well region and a P-type well region in the semiconductor substrate, wherein the N-type well region has a first portion, a second portion, and a third portion, wherein the first portion is between the third portion and the P-type well region, and the third portion is between the first portion and the second portion, and a doping concentration of the third portion is lower than a doping concentration of the first portion and a doping concentration of the second portion;
    forming a gate dielectric layer on the semiconductor substrate, wherein the gate dielectric layer covers the P-type well region and the N-type well region;
    forming a gate electrode on the gate dielectric layer, wherein there is a first interface between the first portion of the N-type well region and the third portion of the N-type well region, and the first interface is aligned with a sidewall of the gate electrode;
    forming a first P-type doping region in the P-type well region;
    forming an N-type source region in the P-type well region; and
    forming a second P-type doping region in the P-type well region and in the first P-type doping region, wherein the second P-type doping region is in direct contact with the N-type source region.

2. The method for forming the semiconductor device as claimed in claim 1, wherein the formation of the first N-type implant region and the second N-type implant region in the semiconductor substrate comprises:
    forming a first implant mask on the semiconductor substrate, wherein the first implant mask has a first opening and a second opening, and there is a distance between the first opening and the second opening; and
    implanting N-type dopants into the semiconductor substrate through the first opening and the second opening.

3. The method for forming the semiconductor device as claimed in claim 2, wherein the formation of the first P-type implant region in the semiconductor substrate comprises:
    forming a second implant mask on the semiconductor substrate, wherein the second mask covers the first N-type implant region and the second N-type implant region, and the second implant mask has a third opening; and
    implanting P-type dopants into the semiconductor substrate through the third opening.

4. The method for forming the semiconductor device as claimed in claim 2, wherein the distance is in a range from 2 μm to 10 μm.

5. The method for forming the semiconductor device as claimed in claim 1, wherein there is a second interface between the second portion of the N-type well region and the third portion of the N-type well region, wherein the doping concentration of the third portion of the N-type well region gradually decreases from the first interface and the second interface to a center region of the third portion of the N-type well region.

6. The method for forming the semiconductor device as claimed in claim 5, wherein a depth of the third portion of the N-type well region gradually decreases from the first interface and the second interface to the center region of the third portion of the N-type well region.

7. The method for forming the semiconductor device as claimed in claim 1, wherein a depth of the third portion of the N-type well region is less than a depth of the first portion of the N-type well region and a depth of the second portion of the N-type well region.

8. The method for forming the semiconductor device as claimed in claim 1, wherein the semiconductor substrate is a P-type semiconductor substrate.

9. The method for forming the semiconductor device as claimed in claim 1, further comprising:
    forming an N-type drain region in the second portion of the N-type well region.

10. The method for forming the semiconductor device as claimed in claim 9, further comprising:
    forming a field oxide on the semiconductor substrate, wherein the field oxide covers the third portion of the N-type well region.

11. A semiconductor device, comprising:
    a semiconductor substrate;
    a P-type well region in the semiconductor substrate;
    an N-type well region in the semiconductor substrate and adjacent to the P-type well region, wherein the N-type well region has a first portion, a second portion, and a third portion, wherein the first portion is between the third portion and the P-type well region, and the third portion is between the first portion and the second portion, and a doping concentration of the third portion is lower than a doping concentration of the first portion and a doping concentration of the second portion;
    an N-type source region in the P-type well region;
    an N-type drain region in the N-type well region;
    a first P-type doping region in the P-type well region;
    a second P-type doping region in the P-type well region and in the first P-type doping region, wherein the second P-type doping region is in direct contact with the N-type source region;
    a gate dielectric layer on the semiconductor substrate, wherein the gate dielectric layer partially covers the P-type well region and the N-type well region; and
    a gate electrode on the gate dielectric layer, wherein there is a first interface between the third portion of the N-type well region and the first portion of the N-type well region, and the first interface is aligned with a sidewall of the gate electrode.

12. The semiconductor device as claimed in claim 11, wherein there is a second interface between the third portion of the N-type well region and the second portion of the N-type well region, and the doping concentration of the third portion of the N-type well region gradually decreases from the first interface and the second interface to a center region of the third portion of the N-type well region.

13. The semiconductor device as claimed in claim 12, wherein a depth of the third portion of the N-type well region gradually decreases from the first interface and the second interface to the center region of the third portion of the N-type well region.

14. The semiconductor device as claimed in claim 11, wherein a depth of the third portion of the N-type well region is smaller than a depth of the first portion of the N-type well region and a depth of the second portion of the N-type well region.

15. The semiconductor device as claimed in claim 11, further comprising:
   a field oxide on the semiconductor substrate, wherein the field oxide covers the first portion, the second portion, and the third portion of the N-type well region.

16. The semiconductor device as claimed in claim 11, wherein the semiconductor substrate is a P-type semiconductor substrate.

17. The semiconductor device as claimed in claim 11, wherein a width of the third portion of the N-type well region is in a range from 1 μm to 8 μm.

* * * * *